United States Patent
Flanner et al.

(10) Patent No.: US 6,410,437 B1
(45) Date of Patent: Jun. 25, 2002

(54) METHOD FOR ETCHING DUAL DAMASCENE STRUCTURES IN ORGANOSILICATE GLASS

(75) Inventors: Janet M. Flanner, Union City, CA (US); Ian Morey, Singapore (SG)

(73) Assignee: Lam Research Corporation, Fremont, CA (US)

( * ) Notice: Subject to any disclaimer, the term of this patent is extended or adjusted under 35 U.S.C. 154(b) by 72 days.

(21) Appl. No.: 09/608,119

(22) Filed: Jun. 30, 2000

(51) Int. Cl.$^7$ ...................... H01L 21/461; H01L 21/302
(52) U.S. Cl. ......................... 438/689; 438/695
(58) Field of Search ................... 438/634, 636, 438/637, 584, 589, 681, 689, 695, 718, 740, 784, 734, 692, 697, 725

(56) References Cited

U.S. PATENT DOCUMENTS

| | | | | |
|---|---|---|---|---|
| 5,817,572 A | * | 10/1998 | Chiang et al. | 438/624 |
| 5,970,336 A | | 10/1999 | Wolstenholme et al. | 438/238 |
| 6,030,901 A | * | 2/2000 | Hopper et al. | 438/711 |
| 6,072,227 A | * | 6/2000 | Yau et al. | 257/642 |
| 6,168,726 B1 | * | 1/2001 | Li et al. | 216/79 |

FOREIGN PATENT DOCUMENTS

| | | |
|---|---|---|
| EP | WO0003432 | 1/2000 |
| EP | WO0103179 | 1/2001 |

OTHER PUBLICATIONS

Morey, et al., "Etch challenges of low-κ dielectrics", Jun. 1999, Solid State Technology, pp. 71–78.
Ellingboe, et al., "Review of Low-κ Dielectric Etching", Sep., 1999, VMIC Conference, pp. 415–422.
PCT International Search Report, Date of Mailing Jan. 24, 2002.

* cited by examiner

*Primary Examiner*—Viet Q. Nguyen
*Assistant Examiner*—David Nhu
(74) *Attorney, Agent, or Firm*—Beyer Weaver & Thomas, LLP

(57) ABSTRACT

Method for forming dual damascene etch structures in wafers, and semiconductor devices formed according to the method. The present invention utilizes the two-step etch process to form dual damascene structures in organosilicate dielectric layers. According to one embodiment of the present invention, a first etch step is undertaken utilizing a first, low selectivity etchant, which etches completely through the trench dielectric and almost completely through the via dielectric, leaving a small remainder of the via dielectric over the barrier layer protecting metalized objects protected by the barrier layer. After the first etch step, a second etch step is performed utilizing a second, highly selective etchant. This second etch step is conducted with little damage to the barrier layer.

An alternative embodiment of the present invention contemplates a "trench-first" etch strategy.

10 Claims, 12 Drawing Sheets

METHOD FOR ETCHING DUAL DAMASCENE STRUCTURES IN ORGANOSILICATE GLASS

FIELD OF THE INVENTION

The present invention relates to semiconductor manufacture. More particularly, the present invention teaches a novel methodology for forming dual damascene structures in semiconductor wafers including at least one low-K dielectric layer.

DESCRIPTION OF THE RELATED ART

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, K, of the material used to form the dielectric layers. As noted above, the dielectric layers in conventional integrated circuits have traditionally been formed Of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-K materials", have been developed. Many of these new dielectrics are organic compounds.

One interesting class of organic low-K materials are compounds including organosilicate glass. By way of example, but not limitation such organosilicate dielectrics include CORAL™ from Novellus of San Jose, Calif.; Black Diamond™ from Applied Materials of Santa Clara, Calif.; and Sumika Film ™ available from Sumitomo Chemical America, Inc., Santa Clara, Calif.

During semiconductor wafer processing, features of the semiconductor device have been defined in the wafer using well-known patterning and etching processes. In these processes a photo resist material may be deposited on the wafer and may then be exposed to light filtered by a reticle. The reticle may be a glass plate that is patterned with exemplary feature geometries that block light from propagating through the reticle.

The development of an effective etching process for an organosilicate glass low-K film such as CORAL™ should take into account several criteria including etch rate, profile control, selectivity to underlying materials as well as critical dimension (CD) control. The etching of low-K dielectric materials was at first approached as if a silicon-based dielectric were being etched. This has not proven particularly effective, as with organic low-K films the chemistries and processes needed to effectively etch the material are substantially different than those for traditional silicon or silicon oxide etching. This has proven even more problematic for the etching of organosilicate glass low-K films.

Organosilicate glass low-K films are often etched using etchant gas flows of similar chemical composition to other materials used in the semiconductor manufacturing process. This can render the manufacture of such devices difficult. One structure which has proven difficult to implement in wafers with small feature sizes and high feature densities while implementing organosilicate glass low-K dielectric films, is a dual damascene structure. Such dual damascene structures include an interconnect layer and one or more vias to provide electrical connectivity to an underlying electrically conductive feature, especially a metalized feature.

What is desired is a methodology for forming a dual damascene etch structure within a wafer, where at least part of the damascene is formed within a low-K organosilicate glass dielectric, while reliably maintaining feature size and density.

What is finally desirable is a methodology which can be implemented using existing equipment and chemistries, while reliably forming the dual damascene within the organosilicate glass low-K dielectric.

These and other advantages of the present invention will become apparent upon reading the following detailed descriptions and studying the various figures of the Drawing.

SUMMARY OF THE INVENTION

In order to accomplish the desired advantages, previously discussed, the present invention teaches a method for forming a dual damascene etch structure in a wafer, where the wafer includes at least one layer of organosilicate glass dielectric. The novel method taught by the present invention includes the steps etching through a major portion of the organosilicate glass dielectric utilizing a first, low selectivity etchant. This etching step leaves a very small remainder portion of the organosilicate glass dielectric atop the barrier layer. Thereafter, the present invention uses a second, low selectivity etchant to etch away the remainder portion of the organosilicate glass dielectric.

BRIEF DESCRIPTION OF THE DRAWING

For more complete understanding of the present invention, reference is made to the accompanying Drawing in the following Detailed Description of the Preferred Embodiments. In the drawing.

Figure 1:
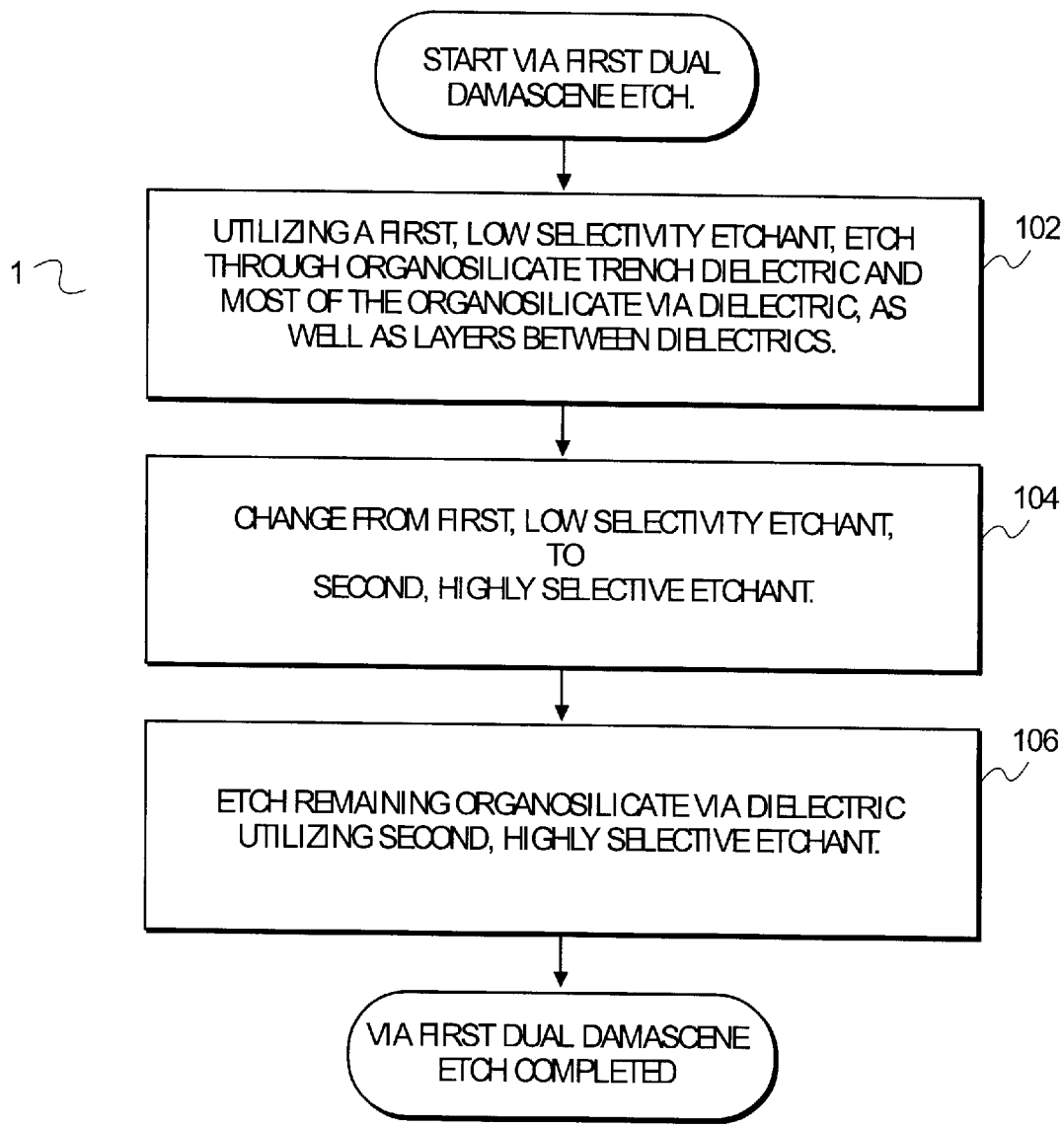
FIG. 1 is an overview flowchart of a two-stage via etching process of the present invention implementing a "via-first" etch strategy.

Reference numbers refer to the same or equivalent parts of the invention throughout the several figures of the Drawing.

DETAILED DESCRIPTION OF THE PREFERRED EMBODIMENTS

The following discussion of several embodiments of the present invention presents various alternatives for forming dual damascene etch structures in wafers incorporating organosilicate dielectrics. The processes disclosed herein are generally conducted within suitable wafer processing equipment, including etch systems. Once such etch system particularly well suited to practicing the present invention is the Exelan$^{Tm}$ dual-frequency dielectric etch system, available from Lam Research Corporation, Fremont, Calif. Exelan is designed specifically to provide advanced processing capability. Exelan's extensive process portfolio includes all dual damascene structures as well as contacts, vias, spacers, and passivation etch in doped and undoped oxides and low-K dielectrics.

Referring now to FIG. 1, an overview of the process of the present invention is shown. The present invention is applicable to a wide variety of semiconductor implementations. In this exemplar, a silicon substrate having a wafer stack formed thereon is assumed. The wafer stack includes at least one layer of OSG dielectric through which it is desired that a structure, for instance a damascene structure, and more particularly a dual damascene structure be formed. Accordingly, at step 102 a first, low selectivity etchant is utilized to etch through the OSG trench dielectric and most of the OSG via dielectric, as well as through any layers between the trench and via dielectrics. At step 104 a change is made from the first, low selectivity etchant to a second, high selectivity etchant. Thereafter, at 106 the remaining OSG via dielectric is etched away.

One embodiment of the present invention contemplates utilizing the previously discussed two-step etching process as part of a via-first dual damascene flow. The process of one such embodiment is shown having reference to FIG. 2. Following deposition of the several layers of the wafer stack, at step 202 the via is patterned using known patterning techniques, for instance photoresists. Thereafter, at 204 the antireflective coating, or ARC, and cap layers are etched open. The term antireflective coating, as used herein specifically include bottom antireflective coatings, BARCs. Thereafter the via etch, 102, is performed as previously described having reference to FIG. 1. At step 206 the first photoresist which enabled patterning of the via is stripped. At 208 a second patterning step is performed which patterns the trench portion of the dual damascene structure. Again, this patterning is conducted according to known principles in the manufacture of semiconductors, including but not necessarily limited to the application of photoresists. At step 210 the trench antireflective coating and cap are etched open. Thereafter, at step 212 the trench portion of the dual damascene structure is etched. At step 214 a second photoresist strip is conducted to remove the photoresist employed for trench pattern step 208. Finally, at step 216 the barrier is etched away.

Figure 2:
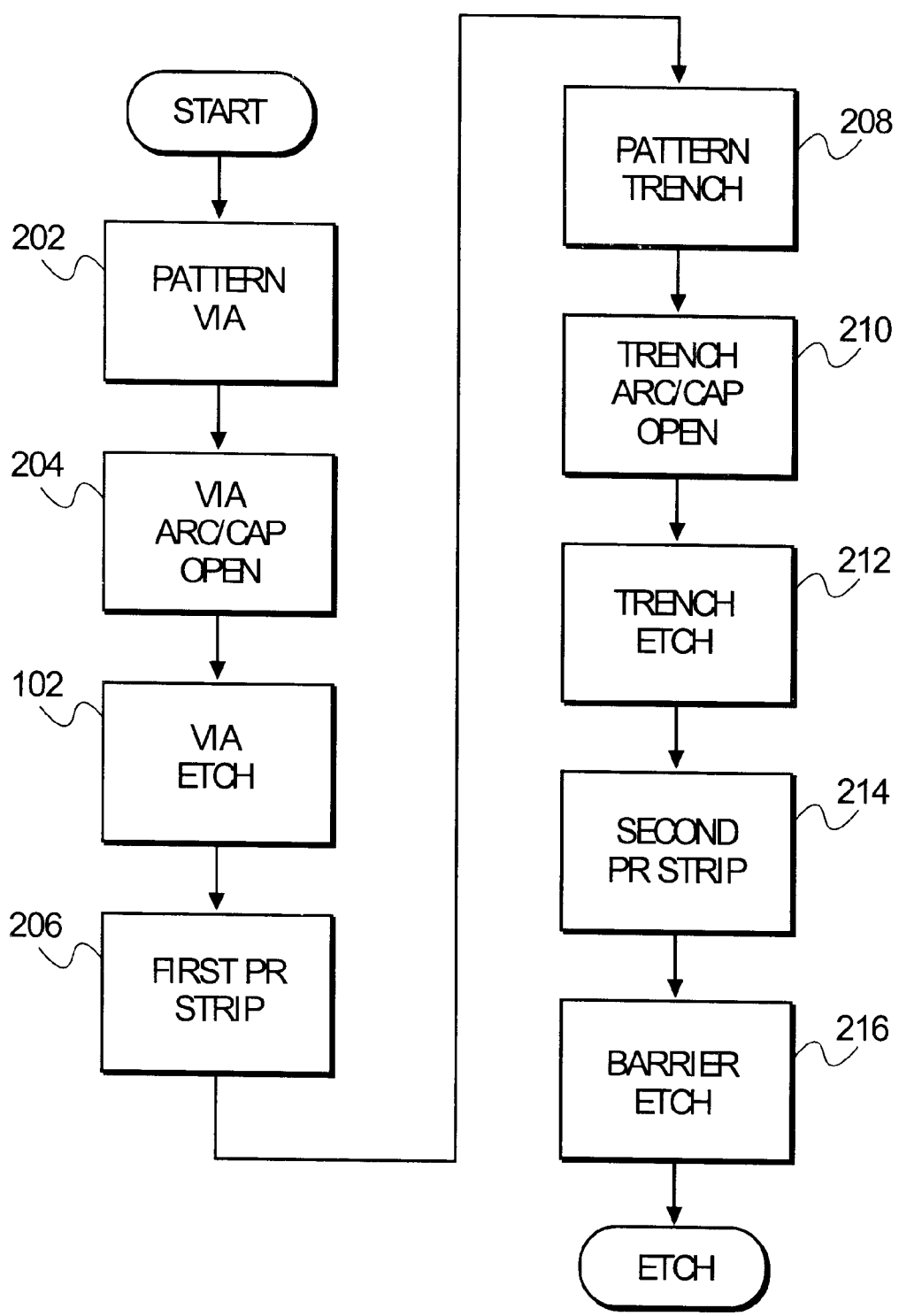
FIG. 2 is a flowchart of one embodiment of the present invention implementing a two-stage via etch into a via-first dual damascene etch.

This embodiment of the present invention is further illustrated having continued reference to FIG. 2 as well as reference to FIGS. 3–14. At FIG. 3 there is shown an exemplar wafer stack, 100. Wafer stack 100 includes a layer of patterned photoresist, 2, applied over a layer of antireflective coating, 4, which in turn has been applied to a cap layer 6. Suitable photoresists include, but are specifically not limited to deep UV photoresists. One source for deep UV photoresists is Arch Chemicals of North Kingston, R.I. Cap layer 6 is applied over a first dielectric layer 8, in this exemplar a layer of organosilicate dielectric. By way of example, but not limitation such organosilicate dielectrics include CORAL™ from Novellus of San Jose, Calif.; Black Diamond™ from Applied Materials of Santa Clara, Calif.; HOSP™ from Allied Signal of Morristown, N.J., and Sumika Film® available from Sumitomo Chemical America, Inc., Santa Clara, Calif. Again in illustration, but not limitation, the present invention contemplates the use of SiN as cap layers.

The trench stop layer, 10, separates the first dielectric layer, 8 from a second dielectric layer 12, again in this exemplar a layer of organosilicate dielectric. Suitable materials for forming trench stop layer 10 include, but again are not limited to TiN, SiN, tetraethylorthosilicate or TEOS, or the like. A barrier layer, 14, separates second dielectric layer 12 from the wafer structure beneath it. Again in illustration but not limitation, the present invention contemplates the use of SiC barrier layers. In this exemplar, the structure underlying second dielectric layer 12 is the silicon substrate, 16, of the wafer. Also shown in this figure is an electrically conductive element 18, formed beneath barrier 14. As used herein the term "metalized object" refers to all such electrically conductive elements including, but specifically not limited to electrical interconnects, metalized layers, and semiconductor elements. As will be evident to those having ordinary skill in the art, the wafer structure from element 2 through element 14 may, with equal facility, be implemented atop other functional layers of the wafer. The principles of the present invention specifically contemplate not only this alternative, but also all such alternative stack arrangements, well known to those having ordinary skill in the art.

Figure 3:
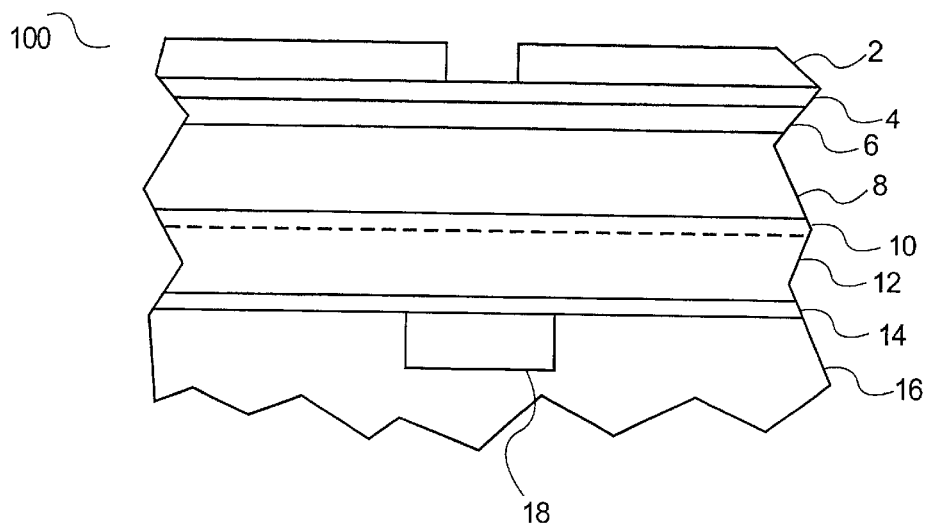
FIG. 3 is a cross-section through an example wafer stack after deposition of a photoresist layer.

The example presented in FIG. 3 includes an optional trench stop layer, 10. The principles presented herein specifically enable embodiments of the present invention wherein trench dielectric 8 and via dielectric 12 are formed as a single unitary layer of dielectric without trench stop layer 10. The methodology for forming a dual damascene structure in this embodiment will be later explained.

Figure 4:
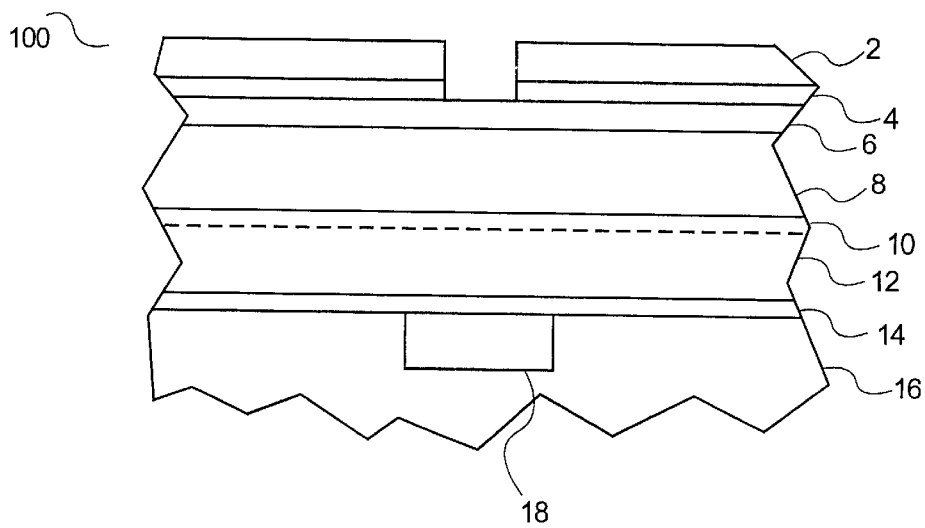
FIG. 4 is a cross-section through the example wafer stack following etching of an antireflective coating layer.
Figure 5:
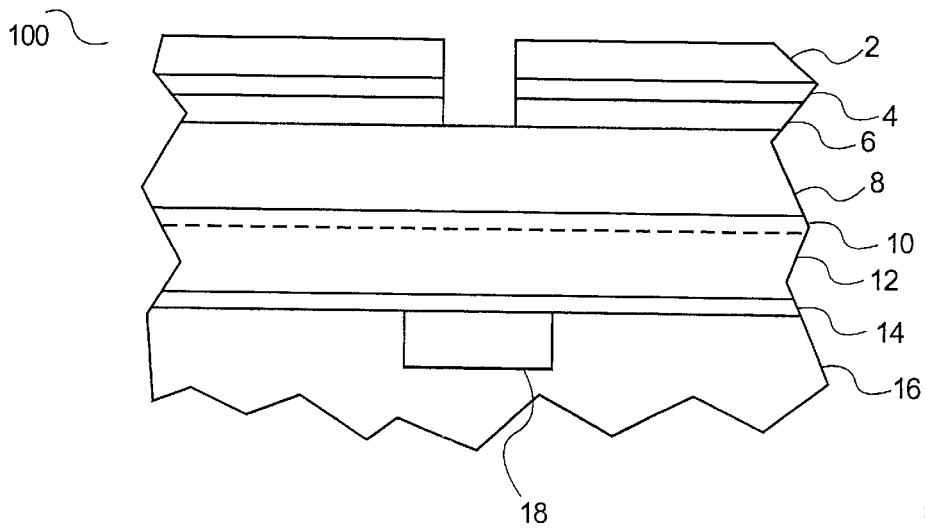
FIG. 5 is a cross-section through the example wafer stack following etching of an antireflective coating layer and a cap layer.

Also shown in FIG. 3 is a layer of patterned photoresist, 2. At this point in the formation of a semiconductor device according to this embodiment of the present invention, the structure has been formed in accordance with step 202 as shown in FIG. 2. After patterning at step 202, one of several further etching steps may be undertaken. In accordance with one such alternative, as shown at FIG. 4, the antireflective coating layer 4 has been opened by means of an etching step. In this example, an etchant reasonably specific to the anti-reflective coating layer, for instance a mixture of $Ar/N_2/O_2$, has been utilized to selectively etch the antireflective layer. Alternative ARC etchants may be used to complete the etching away of the antireflective coating. In another alternative, an etching step which removes both the antireflective coating, 4, and the cap layer 6 beneath the opened portion of photoresist 2 may be implemented. The results of this etching step are shown at FIG. 5. A further alternative may be contemplated with respect to this figure. According to this alternative both the antireflective layer 4 and cap layer 6 are cleared or opened in a single etching step. In yet another alternative an etchant which in one step etches away the bulk of the dielectric layers, the layers interposed therebetween, and the cap layer is contemplated.

Figure 6:
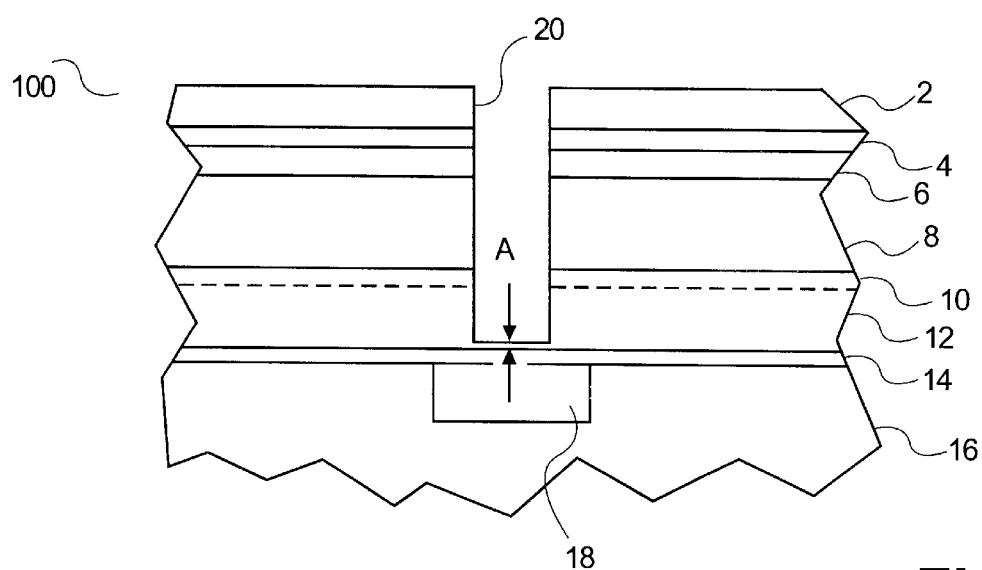
FIG. 6 is a cross-section through the example wafer stack following etching of an antireflective coating layer, a cap layer, a first dielectric layer, a trench stop layer, and most of a second dielectric layer, by means of a first low selectivity etchant.
Figure 7:
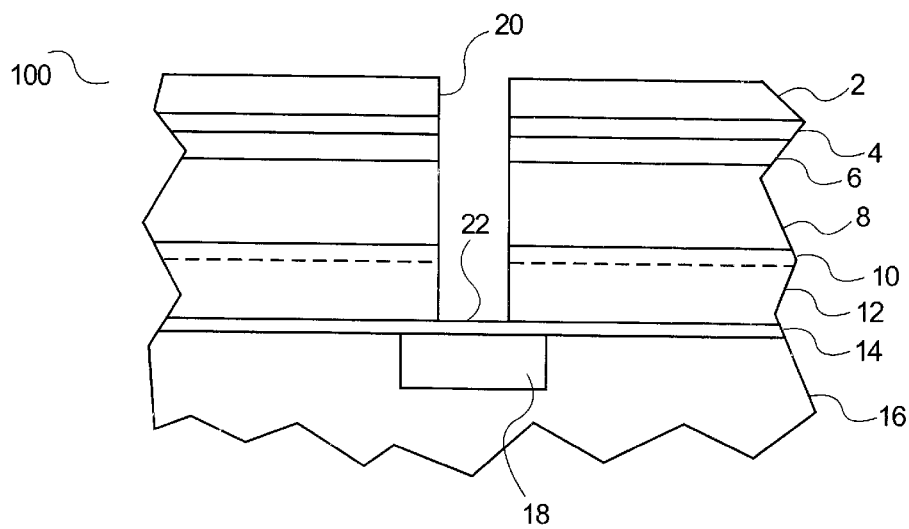
FIG. 7 is a cross-section through the example wafer stack of FIG. 6 following etching away of all the second dielectric layer by means of a second, high selectivity etchant.

Having reference to FIG. 6, this latter embodiment enabled by the process shown at step 102 is being completed. The low selectivity etchant has etched through cap layer 6, trench dielectric layer 8, optional trench stop layer 10, and most of the way through via dielectric layer 12, leaving a very small remainder portion of the via dielectric layer, 12, and forming via etch 20. Low selectivity etchants suitable for CORAL™ include but are not limited to mixtures of $Ar/N_2/CF_4$, $Ar/N_2/C_2F_6$, and $Ar/N_2/C_9F_8/O_2$. As shown at A, a thin layer of via dielectric 12, preferably less than one micron in thickness, and more preferably in a range from about 100 to about 4000 Å in thickness, and more preferably still in a range of about 1000 to 2000 Å in thickness remains.

At this point in the via etch step according to the present invention, step 104 is performed and the etchant gas flow is altered from the first, low selectivity etchant, to a second, highly selective etchant. Examples of etchant gas mixtures which are highly selective for organosilicate glass, and have relatively little reaction with SiC include but are not limited to mixtures of $Ar/N_2/C_4F_8$. Thereafter, step 106 is performed with the highly selective etchant that etches away the remaining thickness of via dielectric 12 shown at A in FIG. 6. This etch step is stopped by barrier layer 14 with minimal loss as shown at 22 in FIG. 7. Preferably, etch step 106 is completed with barrier layer 14 having a remainder thickness of at least 400 Å. More preferable still, barrier layer 14 is left with a remaining thickness of 500–700Å. Still more preferably, barrier layer has a minimum thickness following etch step of 1000 Å. Of course, most advantageous of all would be no loss of barrier material at all. At this point, process 1 is complete.

Some of the advantages of the novel two-step via etch methodology taught by the principles of the present invention are thus explained. As previously discussed, trench stop layer 10 and barrier 14 are often formed of identical, or at least chemically similar materials, including, but not limited to the previously discussed SiC. An etching step sufficiently insensitive to the presence of trench stop layer 10 is not well stopped by barrier layer formed of the same material as the trench stop layer. Utilizing such an insensitive etch all the way to the bottom of the via etch structure runs the very real risk, in the high throughput etching systems demanded by today's semiconductor manufacturers, of completely etching through barrier 14 and into the structures, features or elements underlying barrier 14, for instance metalized object 18. This disadvantageous condition could enable the unwanted diffusion of underlying metals or metallic ions, including copper and copper ions, not shown in this view, into at least one of trench dielectric 8 and via dielectric 12. As is well known to those having ordinary skill in the art, this "poisoning" of the dielectric layer with metallic compounds, including but not limited to copper or copper-bearing compounds, can destroy the transistor effect which is the entire purpose of the manufacture of the semiconductor device.

Figure 8:
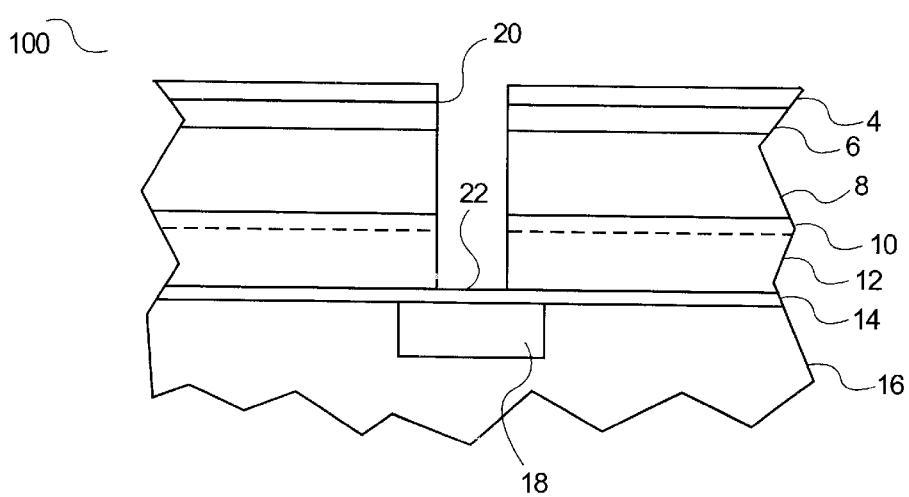
FIG. 8 is a cross-section through the example wafer stack of FIG. 7 following stripping away of a first photoresist layer.
Figure 9:
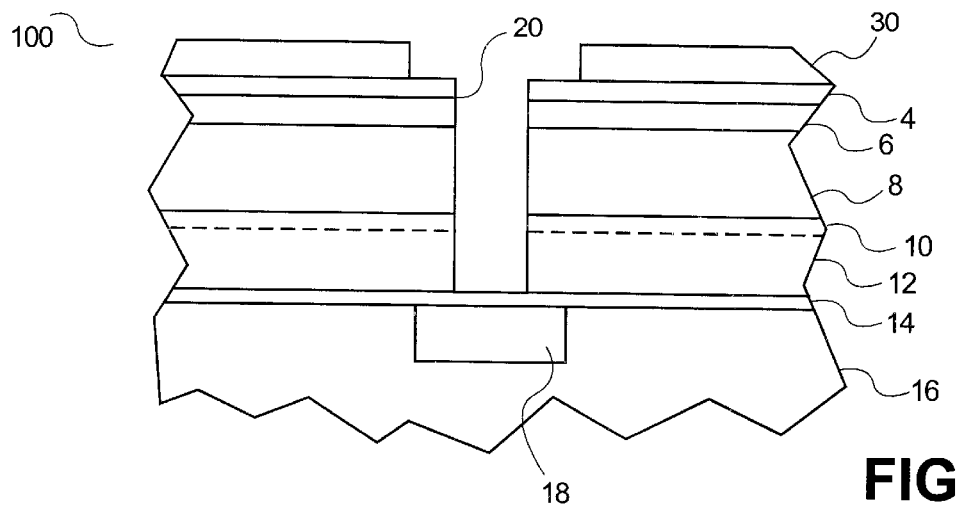
FIG. 9 is a cross-section through the example wafer stack of FIG. 8 following deposition of a second photoresist layer.
Figure 10:
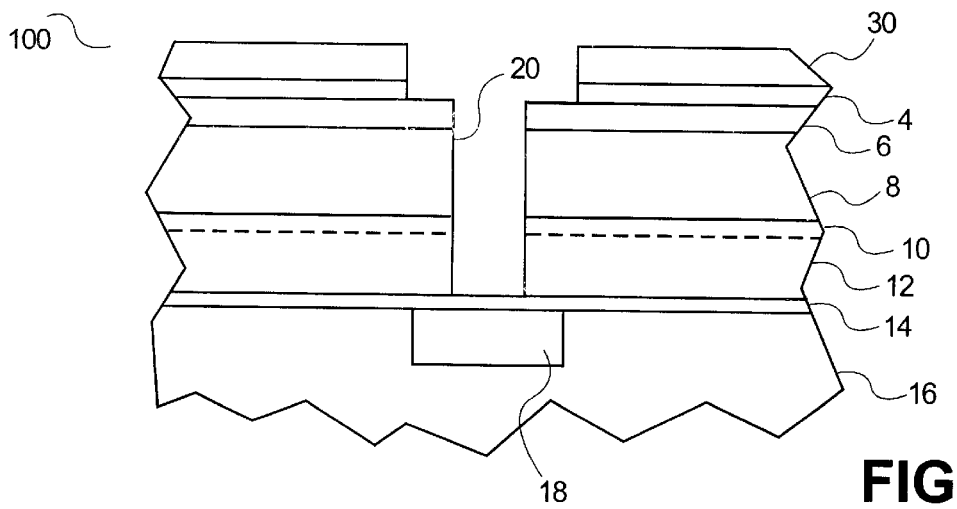
FIG. 10 is a cross-section through the example wafer stack of FIG. 9 following the second etching of the antireflective coating layer.
Figure 11:
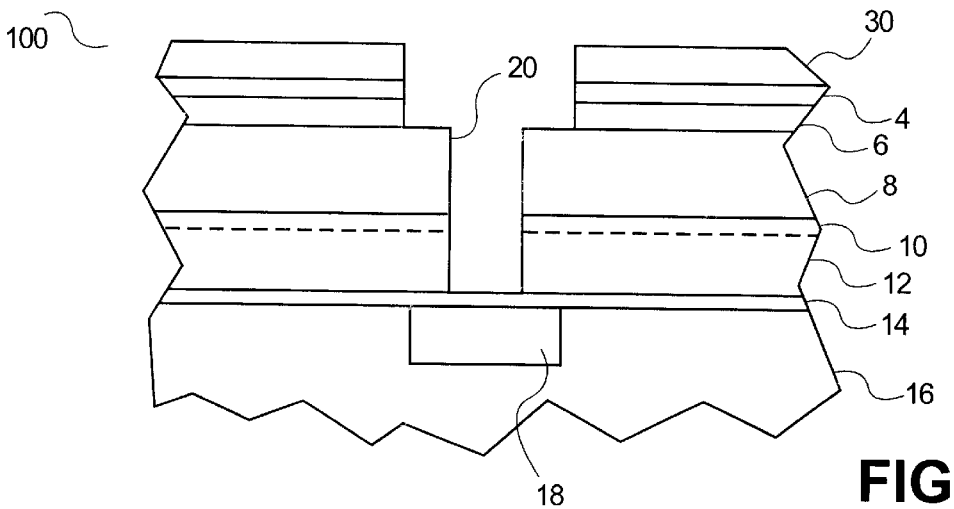
FIG. 11 is a cross-section through the example wafer stack of FIG. 10 following the second etching of the antireflective coating layer and the cap layer.
Figure 12:
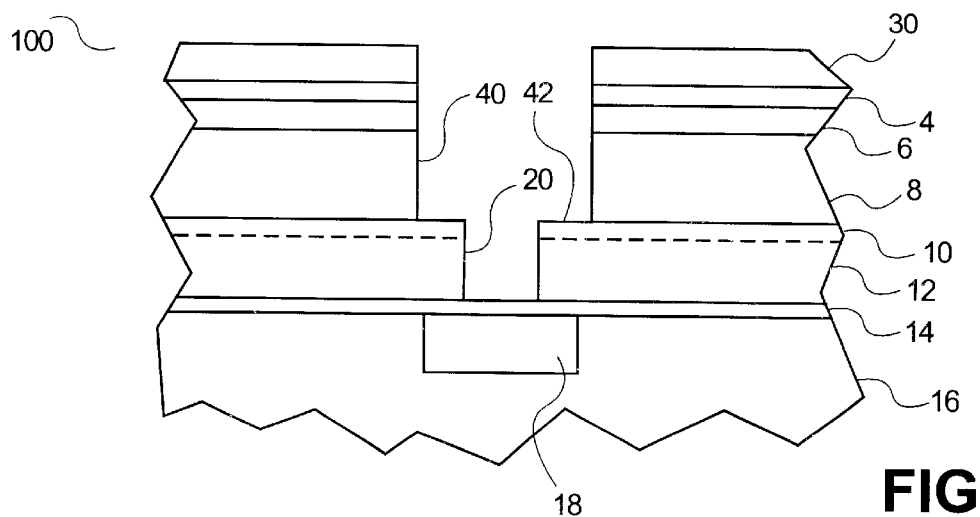
FIG. 12 is a cross-section through the example wafer stack following the second etching of the antireflective coating layer, the cap layer, and the first dielectric layer by means of the first low selectivity etchant.

Having reference now to FIG. 8, wafer 100 is shown following the completion of step 206, wherein the first photoresist layer has been removed from the wafer stack. Thereafter, as shown at FIG. 9, the trench portion of the dual damascene structure is patterned by the application of a second photoresist layer, 30. This corresponds to step 208. Again, the etching through reflective layer coating 4 and cap layers 6 may proceed according to the etching methodologies discussed above. These methodologies include the strategy whereby either antireflective coating layer 4 is etched alone as shown at FIG. 10, the strategy where antireflective coating 4 and cap layers 6 are etched together, as shown at FIG. 11, or the strategy where the etching of the antireflective layer coating 4, cap layer 6, and trench dielectric layer 8 are conducted simultaneously. In any event, the resultant etched structure is shown at FIG. 12, which corresponds to step 212.

Figure 13:
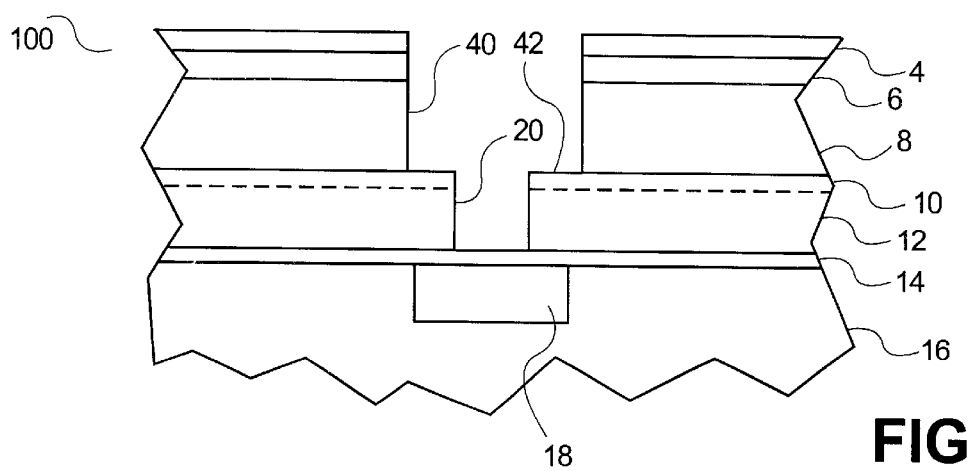
FIG. 13 is a cross-section through the example wafer stack of FIG. 12 following a second stripping of the photoresist layer.

At FIG. 13 there is shown wafer 100 following the stripping of the second photoresist layer, 30, corresponding to step 214.

Figure 14:
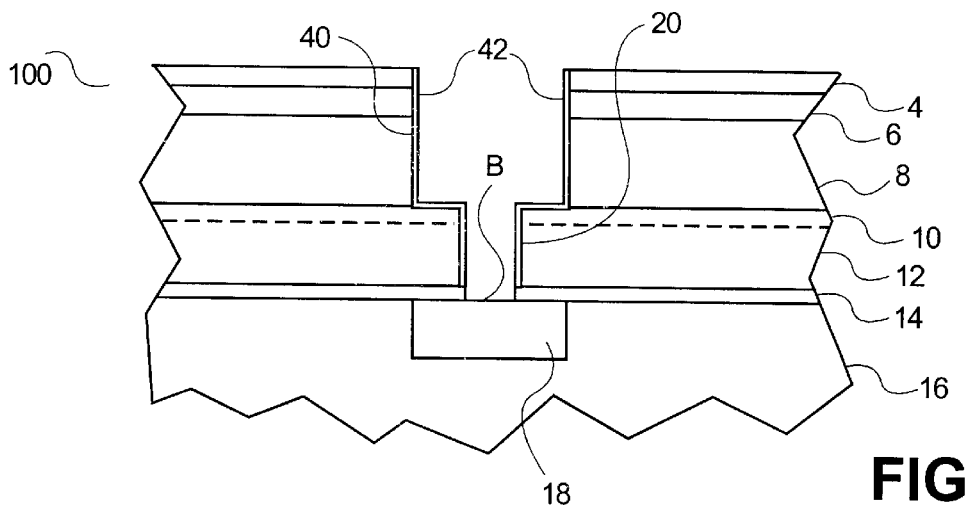
FIG. 14 is a cross-section through the example wafer stack of FIG. 13 following deposition of a barrier coating to the walls the via and trench etches, and the etching away of the barrier layer to expose an underlying structure.

At FIG. 14 wafer 100 a shown following the completion of barrier etch step 216. Suitable barrier etchant gas mixtures include, but are not limited to $Ar/CF_4/CHF_3$. After etching through barrier 14 at B, an electrically conductive barrier coating, 42 is applied to the surfaces of trench etch 40 and via etch 20. This is typically formed of TaN, although other electrically conductive barrier coating materials well known to those having ordinary skill in the art may be substituted therefore. At this point, the dual damascene etch enabled by the present invention is completed in accordance with step 106, and metalized object 18 may be electrically connected by means of an interconnect formed in the dual damascene etch enabled by the principles of the present invention.

Figure 15:
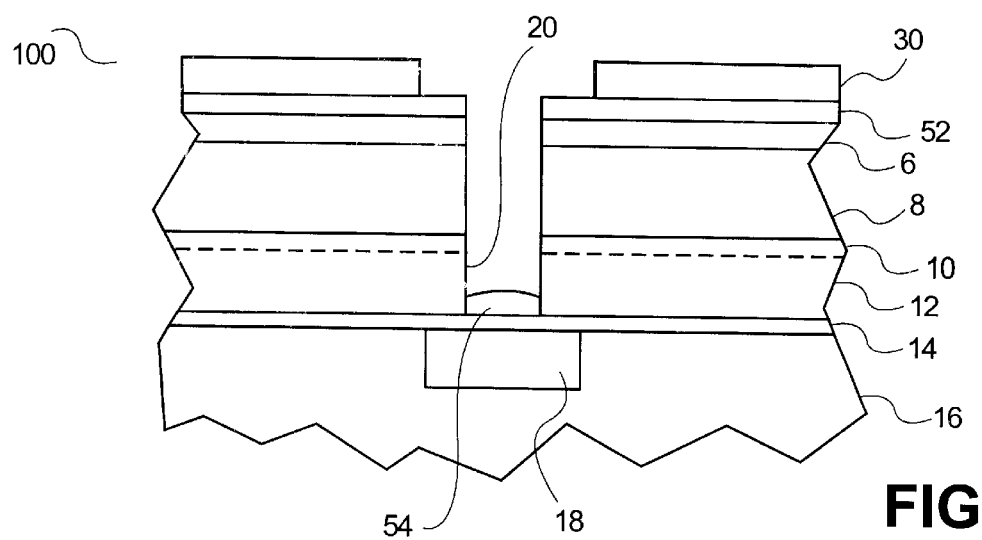
FIG. 15 is a cross-section through the example wafer stack wherein a second application of an antireflective coating has resulted in the formation of a plug at the base of the via etch.

Another embodiment of the present invention is contemplated having reference to FIG. 15. This embodiment contemplates a methodology for minimizing the unwanted removal of antireflective coating 4 as a result of the removal of the first photoresist layer 2 at stripping step 206. Where this situation occurs, and it is necessary to replenish the antireflective coating layer, the layer may be reapplied, as at 52, and the second photoresist, 30 applied over newly deposited antireflective coating layer 52. The deposition of antireflective coating layer 52 results in the unintended deposition of a plug, 54, of antireflective material at the bottom of via etch 20. Plug 42 is advantageously etched away during the trench etch step, 212, previously discussed, or may be removed when second photoresist 30 is stripped. Alternatively, a separate etch step utilizing a flow of $Ar/N_2/O_2$ may be implemented.

Yet another embodiment of the present invention implements a single layer of organosilicate dielectric, unseparated by a trench stop layer. In forming this embodiment, the isotropic etch of the trench is stopped after a predetermined period of time, resulting in the formation of the trench via etch structures.

Figure 16:
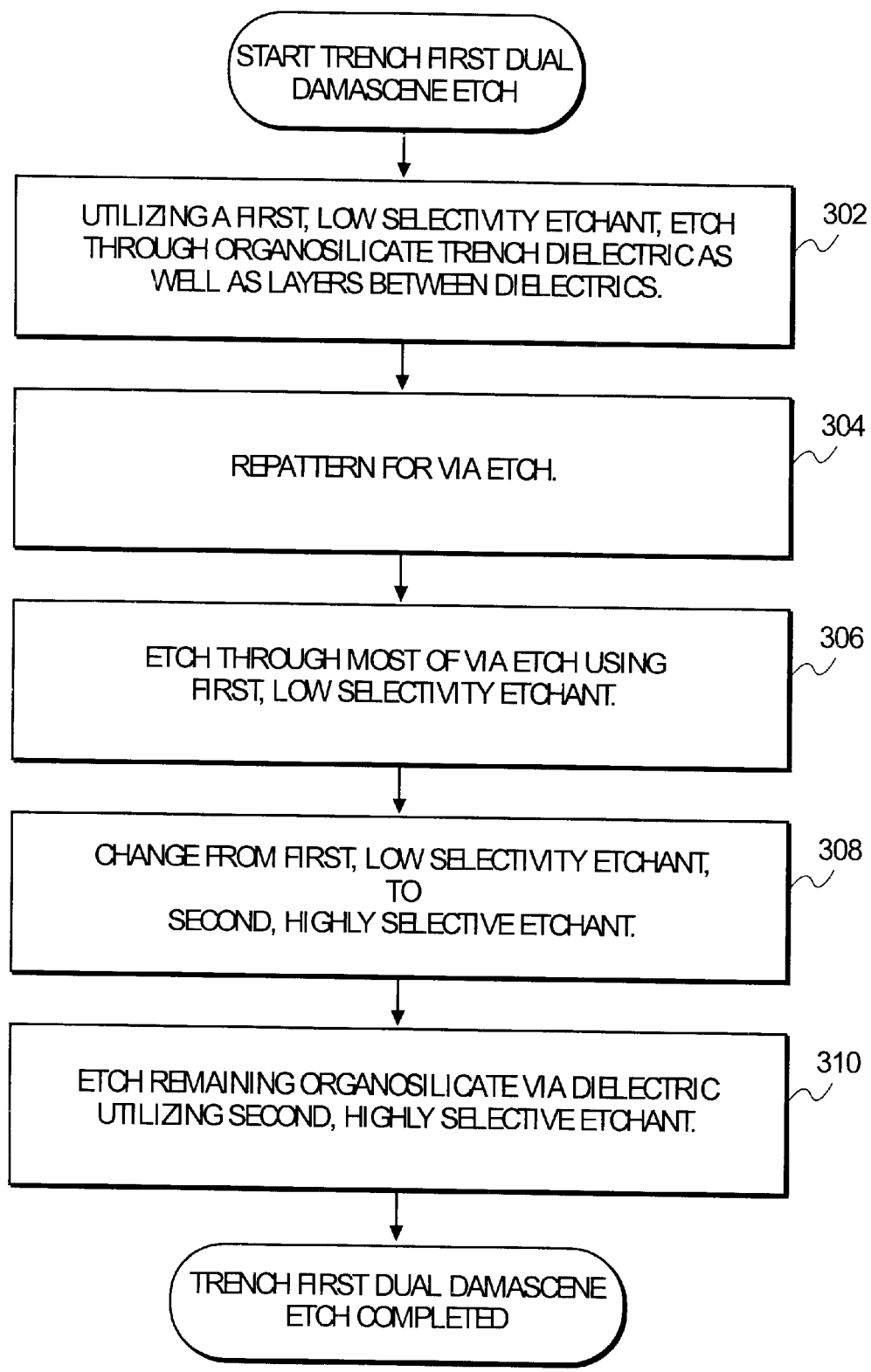
FIG. 16 is overview flowchart of another two-stage via etching process of the present invention, implementing a "trench first" etch strategy.

The previous discussions have centered about one embodiment of the present invention wherein the via etch step 102 of the dual damascene etch is performed before the trench etch 106. This embodiment implements a so-called "via-first" etch strategy. In distinction thereto, the present invention also contemplates a strategy whereby the trench etch step is performed first. This so-called "trench-first" etch strategy, is summarized at FIG. 16.

At step 302 a first low selectivity etchant is utilized to etch through the organosilicate trench dielectric as well as any layers between the trench and via dielectrics. At step 304 the wafer is re-patterned for the via etch step. Most of the via is etched away at step 306 again using the first, low selectivity etchant. At step 308 a change is made from the first, low selectivity etchant, to the second, highly selective etchant. Thereafter, at step 310 the remaining organosilicate via dielectric is etched utilizing the second highly selective etchant. At this point, the trench and via structures have been etched into the wafer.

Figure 20:
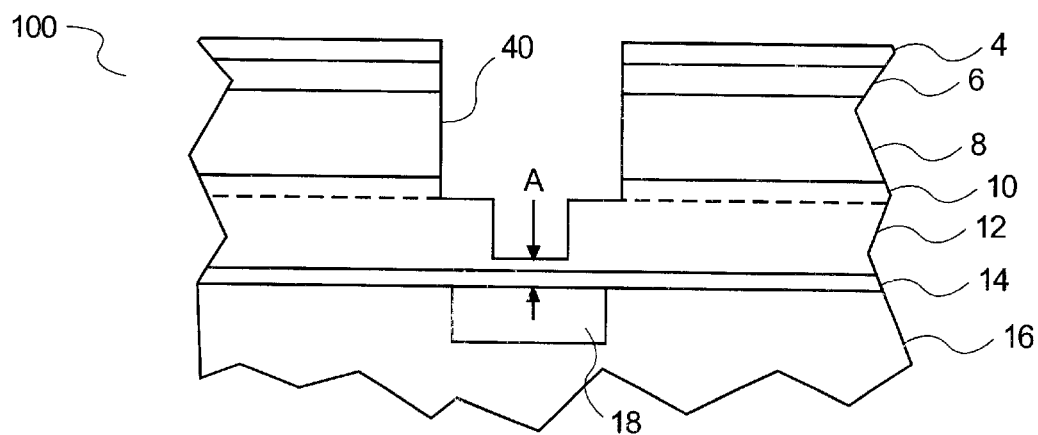
FIG. 20 is a cross-section through the example wafer stack of FIG. 19 after removal of the several layers or applications of photoresist.
Figure 21:
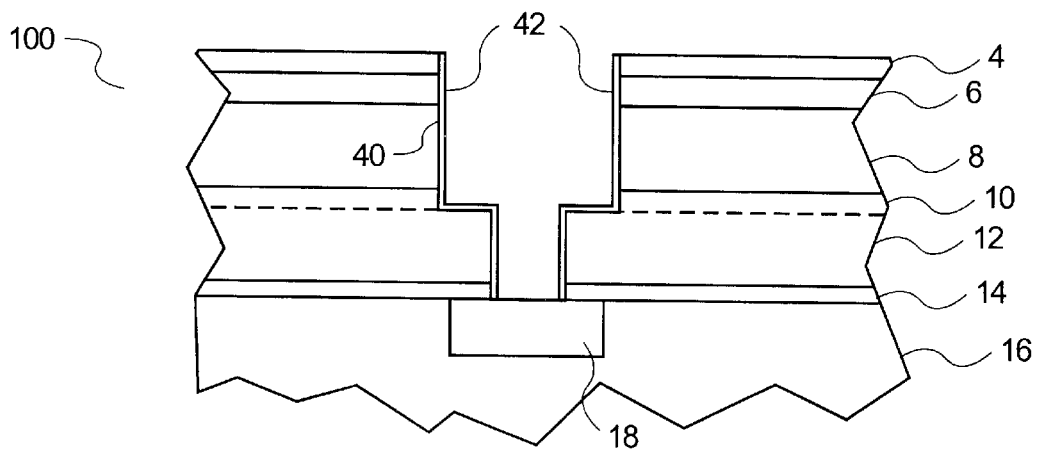
FIG. 21 is a cross-section through the example wafer stack of FIG. 20 following deposition of a barrier coating to the walls of the via and trench etches, and the etching away of the barrier layer to expose an underlying structure.
Figure 22:
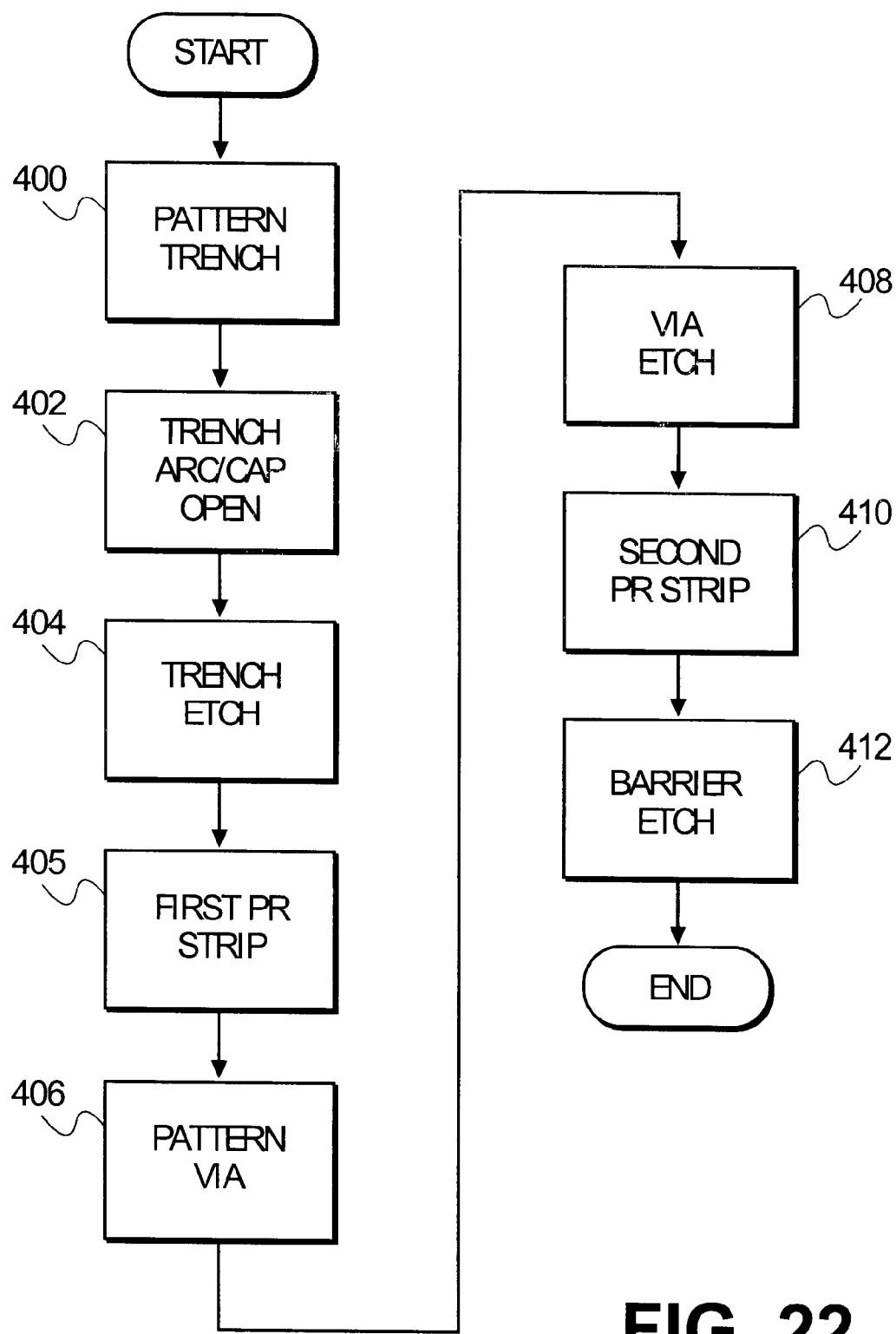
FIG. 22 is a flowchart of one embodiment of the present invention which implements a two-stage via etch into a trench first dual damascene etch.

These steps are further illustrated having reference to FIGS. 17 through 22. Referring now to FIG. 22, the process steps of this embodiment are shown. At step 400 the trench is patterned, for instance by the deposition of a photoresist layer. Thereafter, at step 402 the trench antireflective coating and cap are opened by etching. At step 404 the trench is etched utilizing a first, high selectivity etchant, which etch is stopped on trench stop 10. Thereafter at step 406 the via is patterned by the application of a layer of photoresist applied to the bottom of the trench. Following deposition of the via pattern at step 406, the via is etched at 408, again with a second, low selectivity etchant. Thereafter at step 410 the photoresist applied during at least one of steps 400 or 406 is stripped, utilizing known photoresist stripping methodologies. Finally, at step 412 the barrier is etched.

Figure 17:
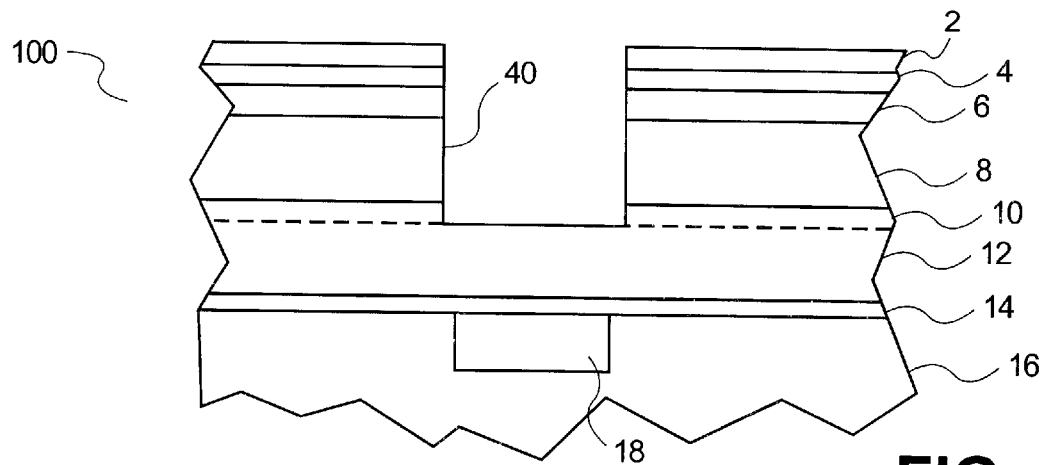
FIG. 17 is a cross-section through an example wafer stack after deposition of a photoresist layer, and subsequent etching away of the first dielectric layer, and the layers overlying it.

Referring now to FIG. 17, a wafer stack 100 has been formed, and trench 40 etched therein utilizing a first, high selectivity etchant. As previously discussed with respect to another embodiment of the present invention, the steps whereby antireflective coating layer 4, cap layers 6 and trench dielectric 8 are etched may be performed with a single etching step, or with a plurality of etching steps capable of etching the several layers simultaneously. This corresponds to steps 400 through 404 a shown at FIG. 22.

Figure 18:
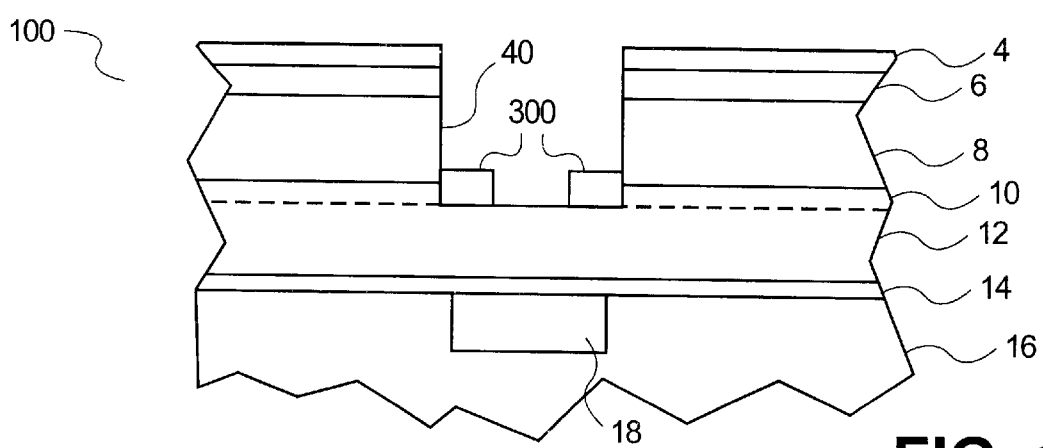
FIG. 18 is a cross-section through the example wafer stack of FIG. 17 after deposition of a second photoresist layer.

Having reference now to FIG. 18, steps 405 and 406 are shown. At step 405 photoresist 2 is stripped, as previously discussed. At step 406, a second application of photoresist, 300, is applied to the bottom of trench 40, which patterns the via portion of the dual damascene etch enabled by the principles of the present invention.

Figure 19:
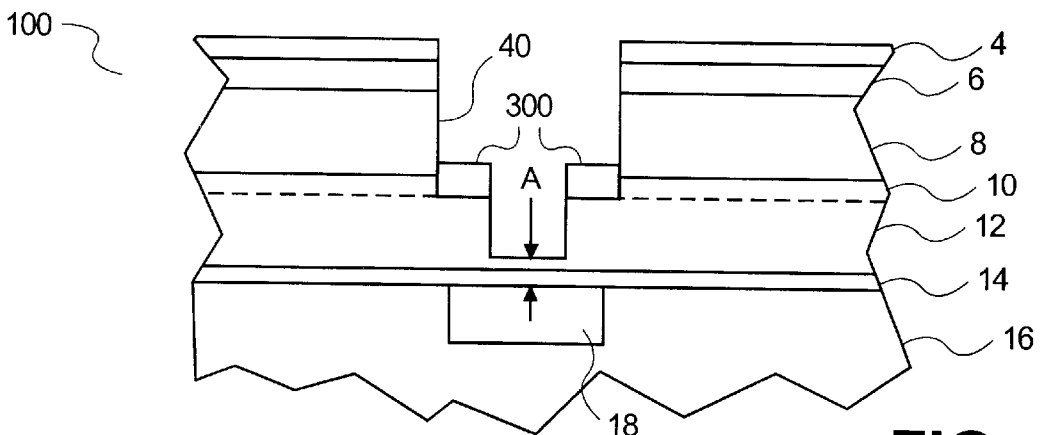
FIG. 19 is a cross-section through the example wafer stack of FIG. 18 after etching away most of a second dielectric layer, by means of a first low selectivity etchant.

Following deposition of photoresist 300, the major portion of via dielectric 12 is etched away, again utilizing the first, low selectivity etchant, as shown at FIG. 19. This step, corresponding to step 408, leaves a portion of via dielectric 12 in place at A following the etching step. The amount of via dielectric remaining is substantially as previously discussed.

With reference now to FIG. 20, etch step 408, second photoresist strip step 410 has been performed, removing photoresist 300 from the bottom of trench 40.

At FIG. 21 barrier etch step 412 has been completed, removing barrier 14 from the bottom of via 20. Thereafter a layer of electrically conductive TaN barrier coating 42 is applied to the sidewalls and bottom of the completed dual damascene etch. The dual damascene etch is now complete, and the further deposition of electrically conductive elements may proceed. This is typically performed by laying down Cu seed followed by Cu deposition/fill.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the incorporation of one or more of the various features and advantages taught herein on a wide variety of semiconductor devices, and further contemplate the implementation of a wide array of layer compositions, appropriate etchant chemistries therefore, etchant flow rates, etch times, reaction vessel pressures, and plasma power levels. Each of these alternatives is specifically contemplated by the principles of the present invention.

What is claimed is:

1. A method for forming a dual damascene etch structure in a wafer, the wafer including a layer of organosilicate glass dielectric, the method comprising the steps of:

first, etching through a major portion of the organosilicate glass dielectric utilizing a first, low selectivity etchant, the first etching step leaving a remainder portion of the organosilicate glass dielectric; and second, etching away the remainder portion of the organosilicate glass dielectric utilizing a sound, highly selective etchant.

2. The method of claim 1 wherein said wafer further includes a metalized object beneath the organosilicate glass dielectric, the metalized object and the organosilicate glass dielectric separated by a barrier layer, the method comprising the further step of:

subsequent to the second etching step, etching through a part of the barrier layer to the metalized object.

3. The method of claim 1 wherein the major portion of the organosilicate glass dielectric further comprises a trench dielectric and most of a via dielectric, and remainder portion further comprises a remainder portion of the via dielectric.

4. The method of claim 3 applied to the formation of a via-first dual damascene structure on a wafer further comprising a layer of antireflective coating and a cap layer applied over the organosilicate glass dielectric layer, the method further comprising, prior to the first etching step, the steps of:

patterning a via on the top of the wafer with a photoresist; and etching open the antireflective coating and the cap layer.

5. The method of claim 4 comprising the further steps, subsequent to the second etching step, of:

stripping the photoresist;

patterning a trench on the top of the wafer with a second photoresist; and etching the trench partially through the organosilicate glass dielectric.

6. The method of claim 5 comprising the further steps of:

forming the organosilicate glass dielectric of a first organosilicate glass dielectric layer and a second organosilicate glass dielectric layer, the first and second organosilicate glass dielectric layers separated by a trench stop layer; and stopping the etching of the trench with the trench stop layer.

7. The method of claim 1 applied to a wafer including a barrier layer beneath the organosilicate glass dielectric, the method comprising the further step of etching through the barrier subsequent to the second etching step.

8. The method of claim 1, wherein the low selectivity etchant is selected from the group of etchant mixtures consisting of $Ar/N_2/CF_4/$, $Ar/N_2/C_2/F_6$, and $Ar/N_2/C_9F_8/O_2$.

9. The method of claim 8, wherein the high selectivity etchant is a mixture of $Ar/N_2/C_4F_8$.

10. The method of claim 1, wherein the major portion of the organosilicate glass dielectric comprises a most of a trench dielectric, and a portion of a via dielectric, and the remainder portion further comprises most of the via dielectric.

* * * * *

UNITED STATES PATENT AND TRADEMARK OFFICE
CERTIFICATE OF CORRECTION

PATENT NO. : 6,410,437 B1
APPLICATION NO. : 09/608119
DATED : June 25, 2002
INVENTOR(S) : Flanner et al.

It is certified that error appears in the above-identified patent and that said Letters Patent is hereby corrected as shown below:

In the Specification:

Column 5, line 59, change "$Ar/N_2/C_2/F_6$" to -- $Ar/N_2/C_2F_6$ --.

Column 5, line 59, change "$Ar/N2/C_9F_8/O_2$" to --$Ar/N2/C_4F_8/O_2$--

In the Claims:

(Column 10, line 12) change "$Ar/N_2/C_2/F_6$" to -- $Ar/N_2/C_2F_6$ --.

(Column 10, line 12) change "$Ar/N2/C_9F_8/O_2$" to --$Ar/N2/C_4F_8/O_2$--

Signed and Sealed this

Twenty-fifth Day of July, 2006

JON W. DUDAS
*Director of the United States Patent and Trademark Office*